(12) United States Patent  (10) Patent No.: US 7,944,697 B2
Hata et al.  (45) Date of Patent: May 17, 2011

(54) ELECTRONIC EQUIPMENT (75) Inventors: Koji Hata, Yokohama (JP); Hiroshi Kuwaki, Fujisawa (JP); Yasushi Kimura, Yokohama (JP); Shinya Hamagishi, Fujisawa (JP); Seiji Asai, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 44 days.

(21) Appl. No.: 12/575,519

(22) Filed: Oct. 8, 2009

(65) Prior Publication Data

US 2010/0181108 A1 Jul. 22, 2010

Related U.S. Application Data (63) Continuation-in-part of application No. 12/022,189, filed on Jan. 30, 2008, now Pat. No. 7,782,618.

(30) Foreign Application Priority Data

Aug. 28, 2007 (JP) .................................. 2007-221425
Oct. 9, 2008 (JP) .................................. 2008-263036

(51) Int. Cl.
  *H05K 7/20* (2006.01)
(52) U.S. Cl. ........ 361/704; 361/676; 361/677; 361/678; 361/703; 361/705; 174/520; 174/547; 174/548
(58) Field of Classification Search .......... 361/676–678, 361/679.54, 690, 703–704, 715; 165/80.2–80.3, 165/185; 174/50, 520, 547–548
See application file for complete search history.

(56) References Cited

U.S. PATENT DOCUMENTS

| | | | | |
|---|---|---|---|---|
| 3,909,679 | A | * | 9/1975 | Petri .............................. 361/710 |
| 5,132,874 | A | * | 7/1992 | Chandler et al. .............. 361/722 |
| 5,424,913 | A | * | 6/1995 | Swindler ................... 361/679.54 |
| 5,969,943 | A | * | 10/1999 | Oyamada ....................... 361/695 |
| 6,147,867 | A | * | 11/2000 | Gaudrel et al. ................ 361/707 |
| 6,407,925 | B1 | | 6/2002 | Kobayashi et al. |
| 6,707,678 | B2 | | 3/2004 | Kobayashi et al. |
| 6,789,612 | B1 | | 9/2004 | Okamoto et al. |
| 7,100,682 | B2 | | 9/2006 | Okamoto et al. |
| 7,436,660 | B2 | | 10/2008 | Pedoeem et al. |
| 7,782,618 | B2 | * | 8/2010 | Hata et al. ..................... 361/704 |
| 2008/0158830 | A1 | | 7/2008 | Tominaga et al. |

FOREIGN PATENT DOCUMENTS

JP    05-069980    9/1993

(Continued)

*Primary Examiner* — Jayprakash N Gandhi
*Assistant Examiner* — Robert J Hoffberg
(74) *Attorney, Agent, or Firm* — Antonelli, Terry, Stout & Kraus, LLP.

(57) ABSTRACT

Electronic equipment installed outdoors to house an internal unit is provided, meeting the waterproof standard and having an easily replaceable structure of the internal unit. The electronic equipment has an enclosure having a cover and a case with an opening and an air vent, and an internal unit in which an electronic component is mounted. The internal unit has a heat sink and radiation fins for releasing heat generated by the electronic component. The fins are inserted into the opening. The heat sink has a draining portion formed below the fins in a direction perpendicular to an extending direction of the radiation fins, a groove for waterproofing around the fins except an upper portion thereof, and two protrusions for fitting above the fins. The case has a rib for waterproofing around the opening except an upper portion thereof, and two holes for fitting above the opening.

8 Claims, 11 Drawing Sheets

FOREIGN PATENT DOCUMENTS

| | | |
|---|---|---|
| JP | 10-173371 | 6/1998 |
| JP | 11159800 A * | 6/1999 |
| JP | 11-230583 | 8/1999 |
| JP | 2000-307276 | 11/2000 |
| JP | 2003-101266 | 4/2003 |

* cited by examiner

ELECTRONIC EQUIPMENT

This is a continuation-in-part of application Ser. No. 12/022,189, filed on Jan. 30, 2008, now U.S. Pat. No. 7,782,618, the content of which is hereby incorporated by reference into this application.

CLAIM OF PRIORITY

The present application claims priority from Japanese patent application serial no. 2008-263036, filed on Oct. 9, 2008, the content of which is hereby incorporated by reference into this application.

BACKGROUND OF THE INVENTION

The present invention relates to electronic equipment, and more particularly to electronic equipment installed outdoors.

Outdoor equipment enclosures for North America must successfully complete the standards of North America. Particularly, it is necessary to pass the following three tests relating to waterproofing, which are described in "Generic Requirements for Electronic Equipment Cabinets", Telcordia Technologies, March 2000, GR-487-CORE issue 2, Section 3.28. Incidentally, Wind Driven Rain test is the most severe of the three tests.

1. Wind Driven Rain Test

After water spraying on the front surface, right surface, and left surface of an enclosure for 30 minutes each with a rainfall intensity of 150 mm/hr and a wind speed of 31 m/sec, the amount of water penetrating into the enclosure shall not exceed 1 cm^3 (cm$^3$) (1 gram of water) per 0.028 m^3 (m$^3$) (1 ft^3 (ft$^3$)).

2. Rain Intrusion Test

Water droplets accumulated in the surface grooves and the door frame shall not enter the enclosure immediately after heavy rain. After water spraying on the front surface and the two side surfaces for 15 minutes each, the amount of water penetrating into the enclosure shall not exceed 1 cm^3 (cm$^3$) (1 gram of water) per 0.028 m^3 (m$^3$) (1 ft^3 (ft$^3$)).

3. Lawn Sprinklers Test

After simulation of sprinkler water spraying at a downward angle of 45 degrees on the front surface and the two side surfaces for 15 minutes or 45 minutes in total, the amount of water penetrating into the enclosure shall not exceed 1 cm^3 (cm$^3$) (1 gram of water) per 0.028 m^3 (m$^3$) (1 ft^3 (ft$^3$)).

In addition to the waterproof standard described above, the outdoor equipment enclosure for North America should meet the requirement that an electronic component housed therein can easily be replaced. In other words, the enclosure should have a structure capable of replacing an internal unit including an electronic component within the enclosure, instead of replacing the whole equipment, for the maintenance and replacement of the equipment. This is also the specification that allows the installation of the enclosure first and then the installation of the internal unit afterwards.

Further, from the point of view of the cost and weight, the material of the enclosure is preferably resin. However, it is difficult for a resin seal enclosure to fully achieve radiation performance. Hence, it is necessary to ensure the radiation performance by providing an opening in the resin enclosure through which a radiation fin of a heat sink thermally connected to the electronic component, is partially exposed to the outside of the resin enclosure. Here, the heat fin may be splashed with water, but the water penetration into portions other than the radiation fin is not allowed.

Further, in general, the electronic component and the heat sink are connected by a thermally conducted sheet. This makes it difficult to remove only a board in which the electronic component is mounted in the maintenance and replacement of the electronic component. Thus, the replacement of the electronic component should be done by removing the electronic component together with the heat sink. The unit of replacement is called an internal unit.

US 2009/0059534 discloses electronic equipment that can facilitate heat conduction from the inside to the outside of an enclosure in which an internal unit can be replaced. The enclosure structure of the electronic equipment is provided with a heat sink for releasing the inside heat. The heat sink has a heat radiation surface exposed from the bottom of the enclosure to increase the efficiency of releasing the heat from the inside to the outside of the enclosure. A canopy structure is provided below the radiation fin in order to prevent water from entering into the enclosure. In addition to the canopy structure, the electronic equipment has a structure in which a rib formed around the entire periphery of the opening for the heat sink of the case is fitted into a groove formed around the entire periphery of the heat sink, sufficiently providing the waterproof performance without using packing between the case and the heat sink. However, this structure requires eight screws to mount the internal unit. Thus, the replacement of the internal unit should be done by removing all the eight screws and tightening them again. Further, the internal unit is not fixed to the case without the screws tightened, and is likely to fall down in the replacement operation. Thus, the replacement performance is not good.

SUMMARY OF THE INVENTION

Figure 1A:
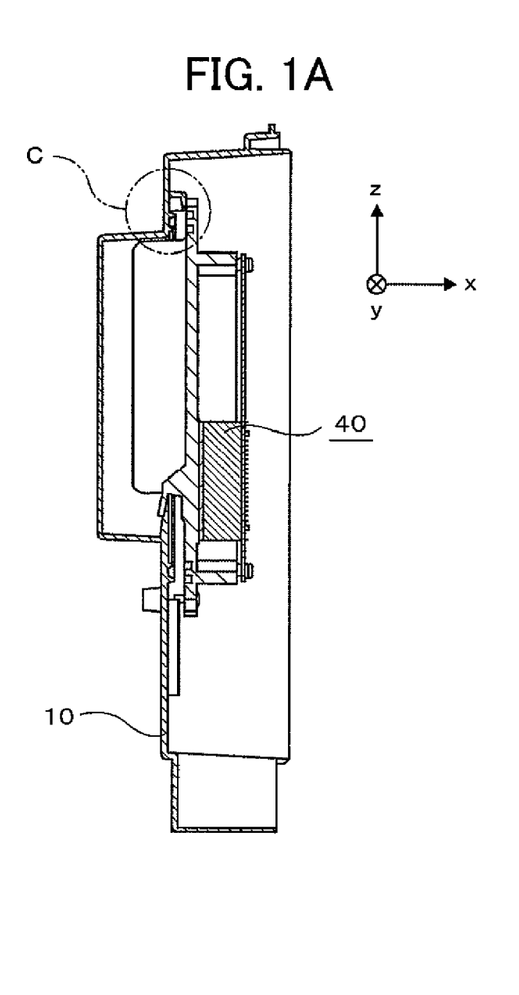
FIGS. 1A and 1B are cross-sectional views of a key assembly, showing a measure for preventing falling down of an internal unit of electronic equipment.
Figure 1B:
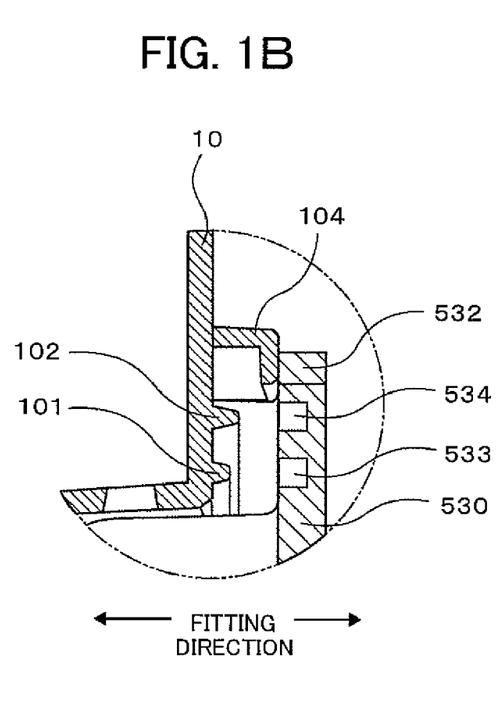

A proposed measure to prevent falling down of the internal unit in the replacement operation will be described with reference to FIGS. 1A and 1B. Here, FIG. 1A is a cross sectional view taken along line A-A of FIG. 5 of an embodiment described later. In the figure, a unit cover 510 is omitted for simplicity, and a hole 104 of the case 10 is viewed in across section taken along line B-B of FIG. 5. FIG. 1B is an enlarged view of a portion C in FIG. 1A. As is apparent from FIGS. 1A and 1B, which show the proposed measure to prevent falling down of the internal unit, the hole 104 of the case 10 and a protrusion 532 of the heat sink 530 are fitted together to prevent the internal unit 40 from falling down rotating about the y axis. In the portion C, however, a first groove 533 and a second groove 534 exist in the y axis of a radiation fin 540 of the heat sink 530. A first rib 101 and a second rib 102 exist above an opening 130 of the cover 10. In such a case, the protrusion 532 is not inserted into the hole 104, so that the case 10 and the heat sink 530 are not fitted together.

The present invention provides electronic equipment meeting the waterproof standard of North America for outdoor installation with a replaceable internal unit including an electronic component.

Further, the present invention provides electronic equipment meeting the waterproof standard of North America for outdoor installation with a replaceable internal unit including an electronic component, in which the internal unit can easily be replaced.

The present invention solves the above problems by providing electronic equipment including an enclosure having a case with an opening formed therein and a cover, and an internal unit in which an electronic component is mounted. The internal unit has a heat sink for absorbing heat generated by the electronic component, plural radiation fins formed in the heat sink to release the heat from the heat sink, and a draining portion formed below the radiation fins of the heat sink in a direction perpendicular to an extending direction of the radiation fins. The radiation fins of the internal unit are inserted into the opening of the case of the enclosure. The case has a rib arranged in a horseshoe shape around the opening except an upper portion thereof. The heat sink has a groove formed around the radiation fins except an upper portion thereof so as to receive the rib. The electronic equipment further includes: protrusions for falling-down prevention in the upper portion of the inside of the heat sink, in order to prevent the internal unit from falling down rotating forward about the bottom side of the internal unit, when the internal unit connected to the heat sink is connected to the enclosure (case) in a plane including the vertical direction; and holes into which the protrusions of the heat sink mounted to the case are fitted. The rib is formed in the three sides of the opening except the upper side thereof for the heat sink of the case. The groove is formed in the three sides of the heat sink except the upper side thereof. The rib and the groove are fitted together.

According to the present invention, it is possible to provide electronic equipment meeting the waterproof standard of North America for outdoor installation with a replaceable internal unit including an electronic component. Further, according to the present invention, it is possible to provide electronic equipment meeting the waterproof standard of North America for outdoor installation with a replaceable internal unit including an electronic component, in which the internal unit can easily be replaced.

DETAILED DESCRIPTION OF THE PREFERRED EMBODIMENTS

Figure 2:
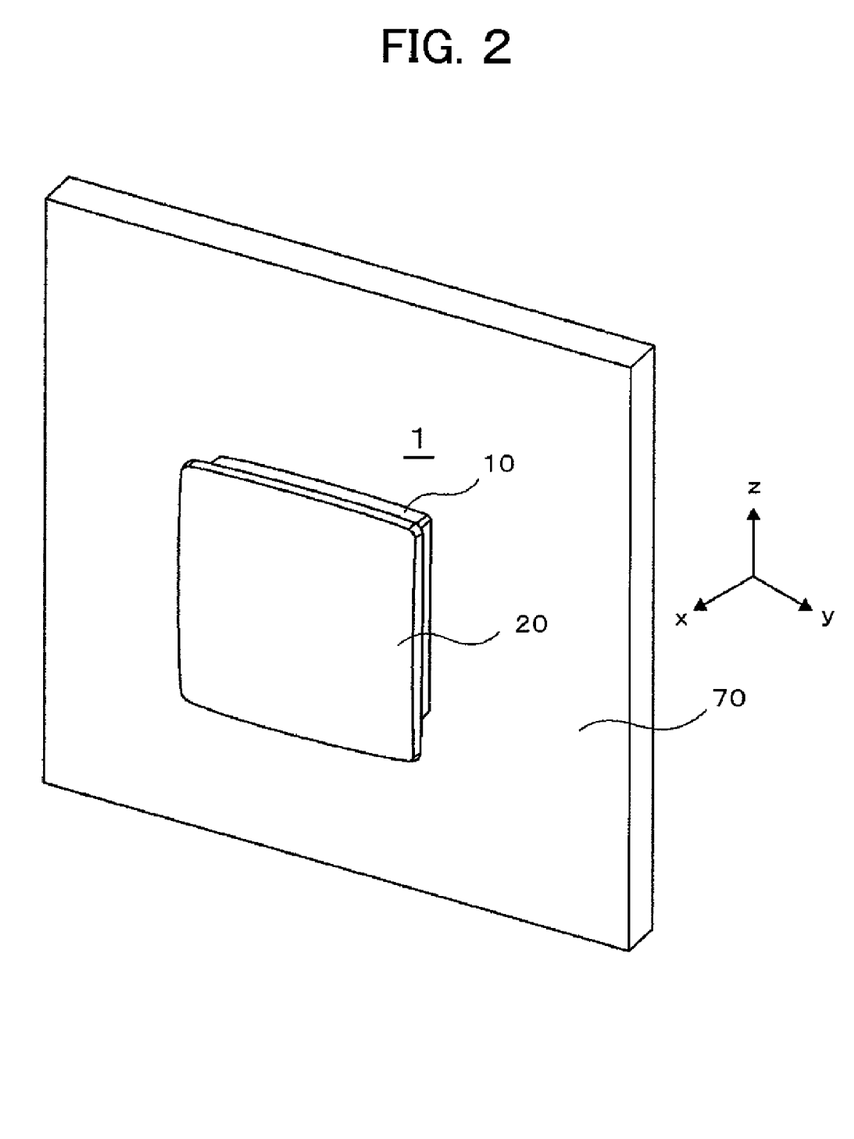
FIG. 2 is a perspective view showing a state in which an enclosure is attached to an outdoor wall surface.
Figure 3:
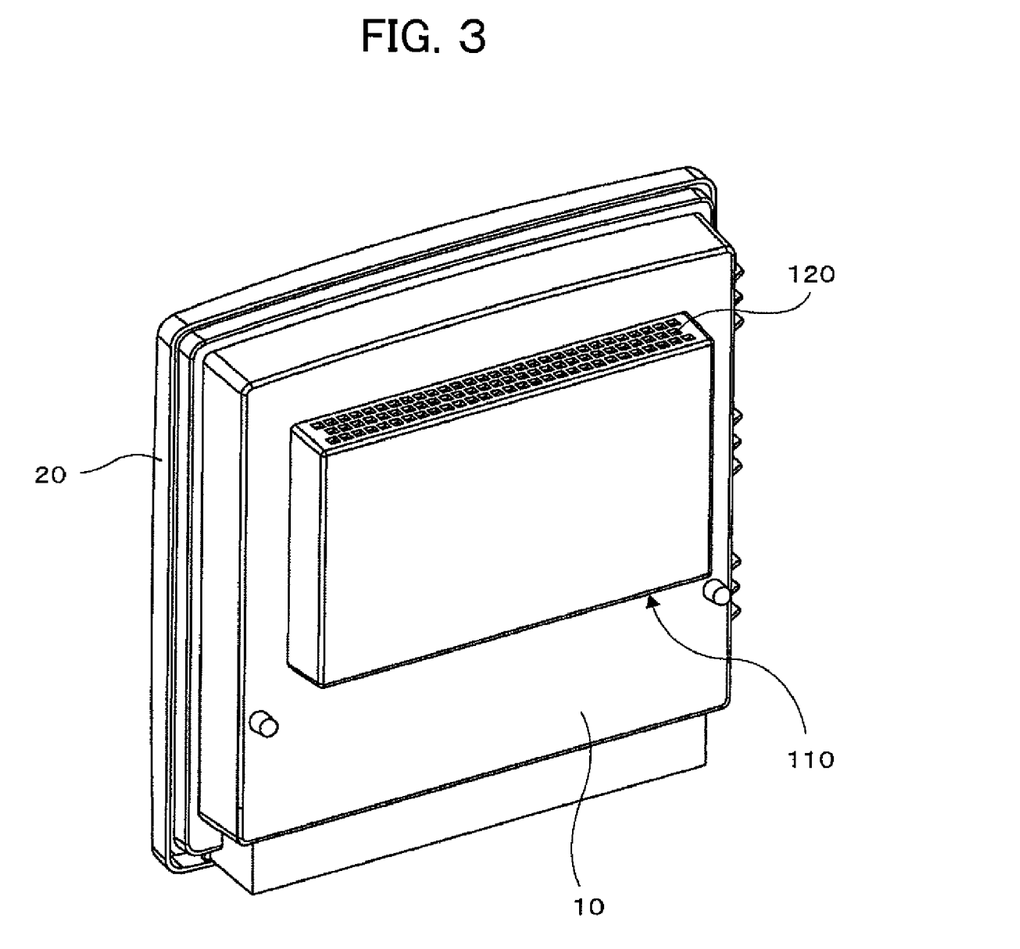
FIG. 3 is a perspective view of the back side of the enclosure.
Figure 4:
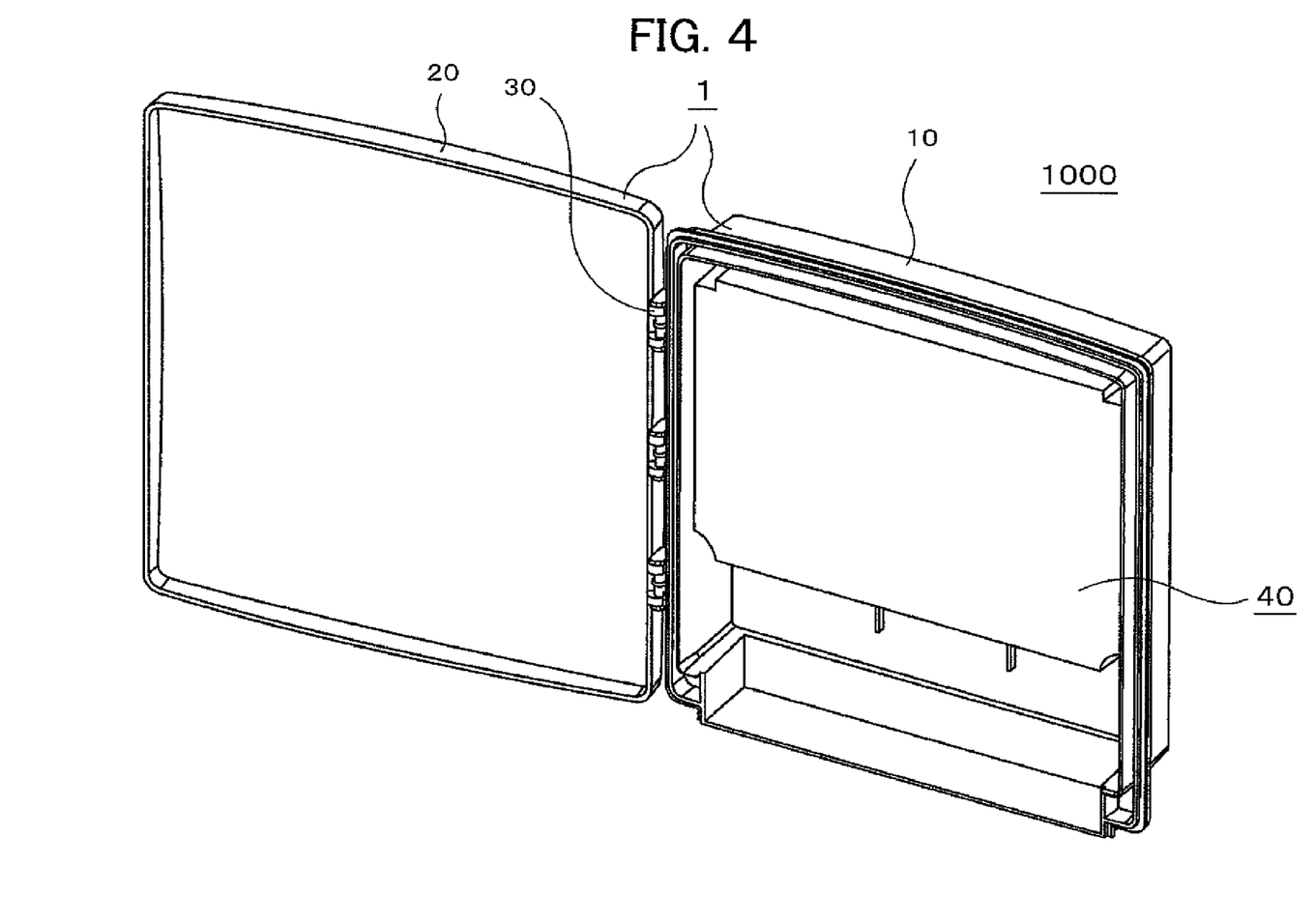
FIG. 4 is a perspective view of a state in which a cover of the electronic equipment is open.
Figure 5:
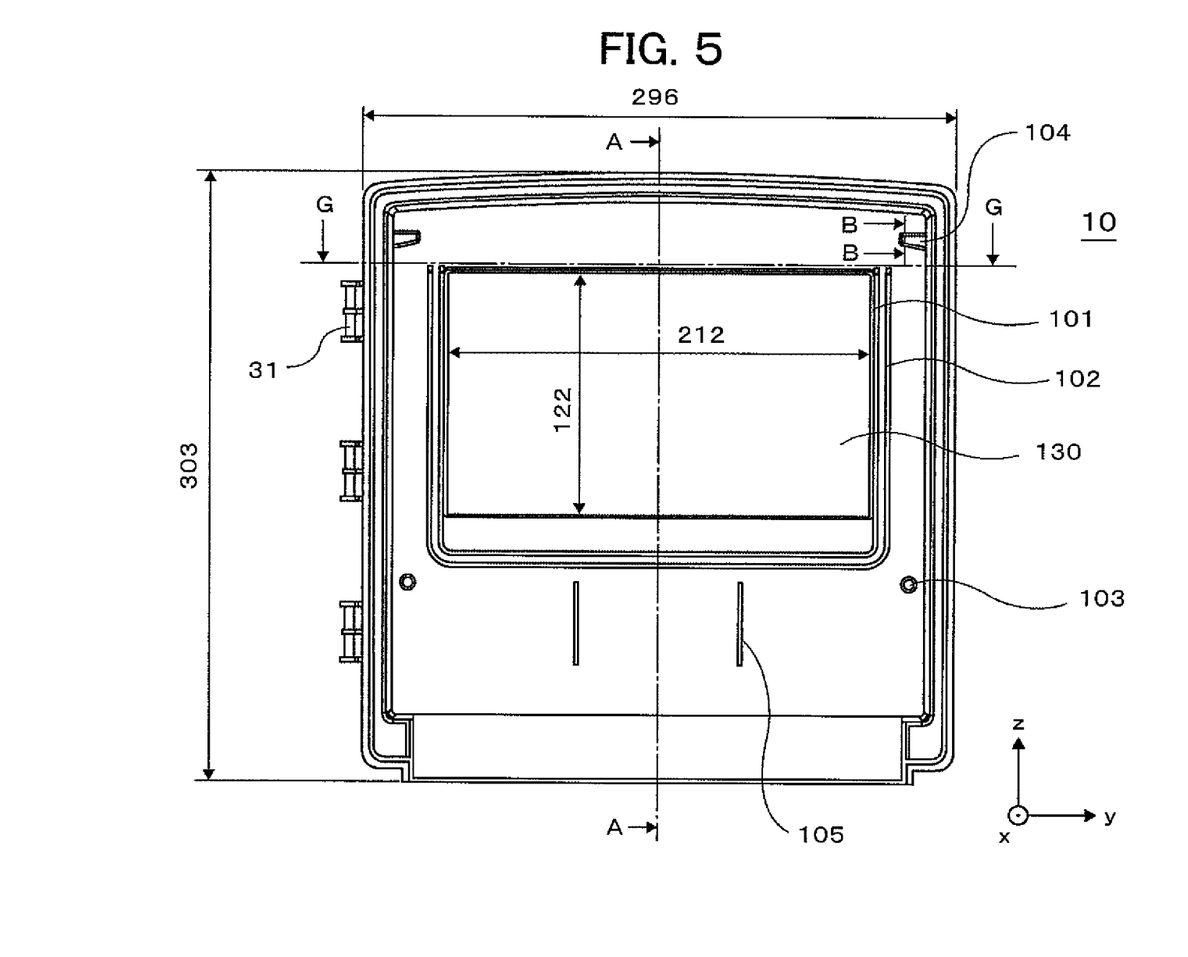
FIG. 5 is a front view of a case of the enclosure.
Figure 6:
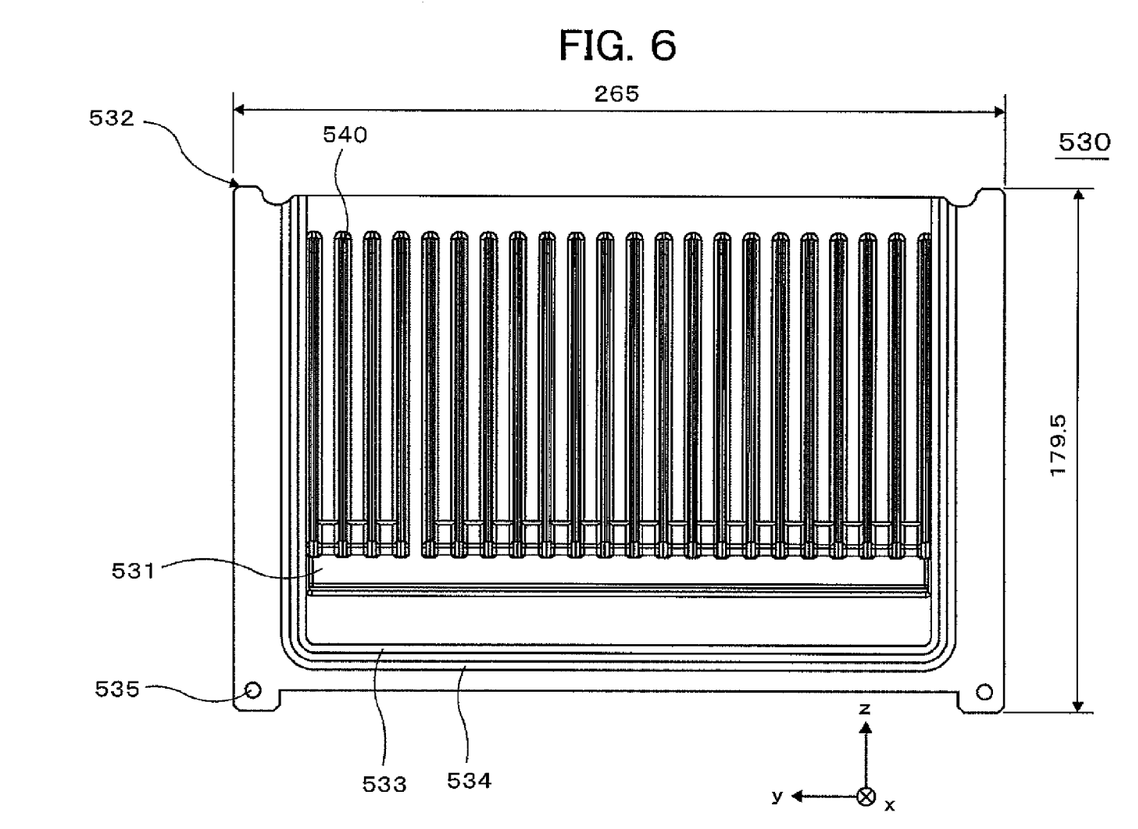
FIG. 6 is a front view of a heat sink on the side of radiation fins.
Figure 7:
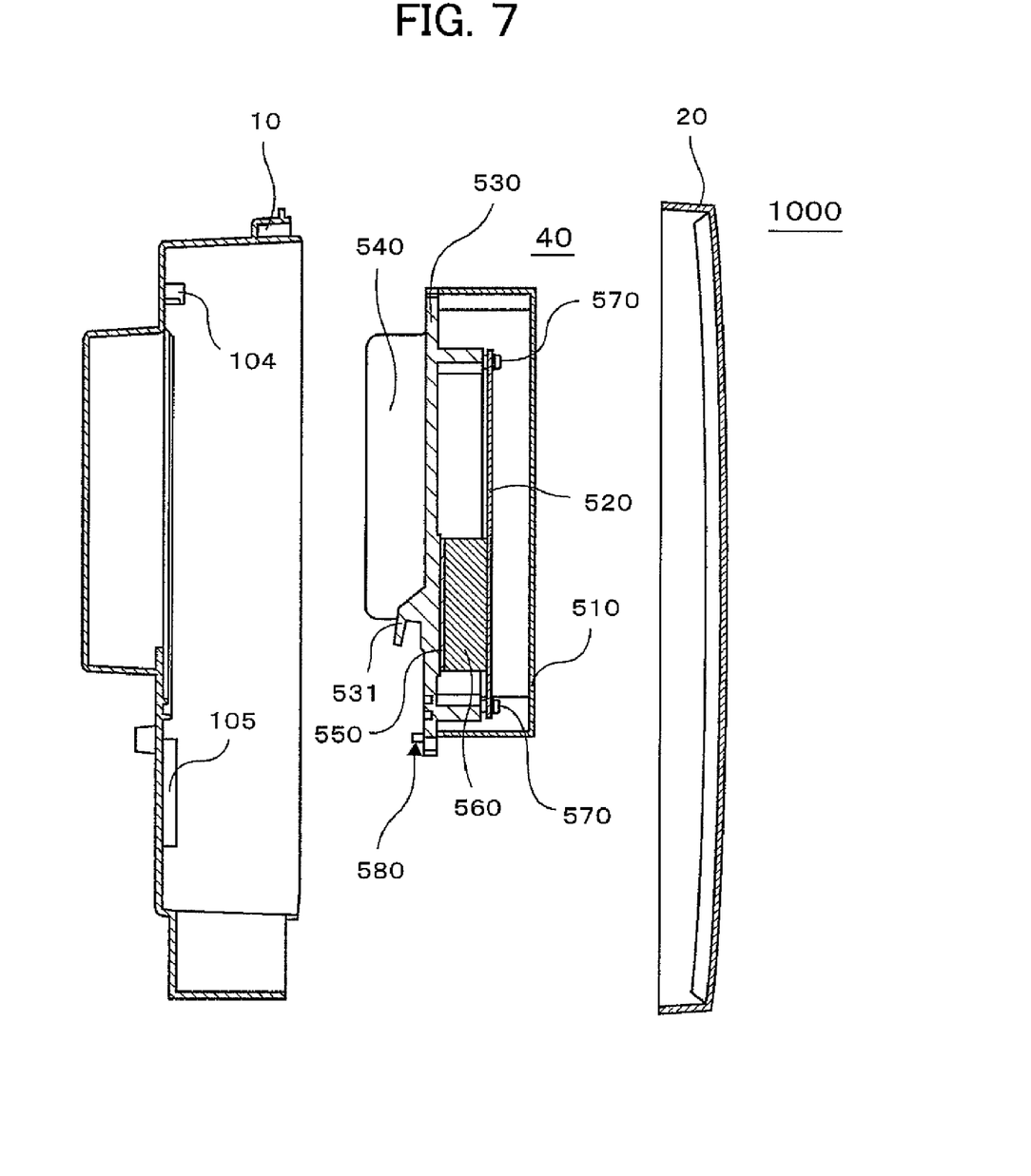
FIG. 7 is a cross-sectional view of the electronic equipment to be assembled.
Figure 8:
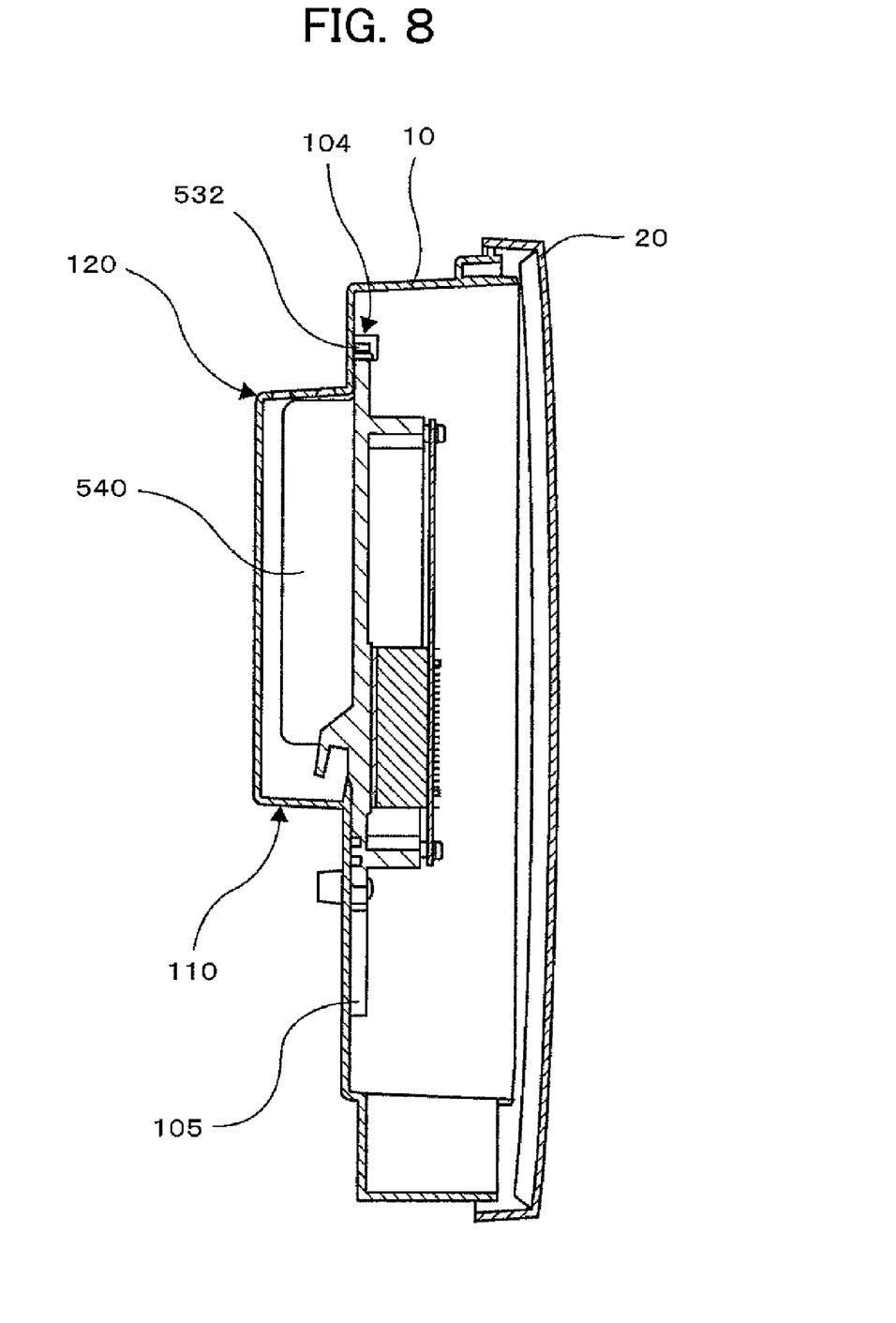
FIG. 8 is a cross-sectional view of the electronic equipment.
Figure 9A:
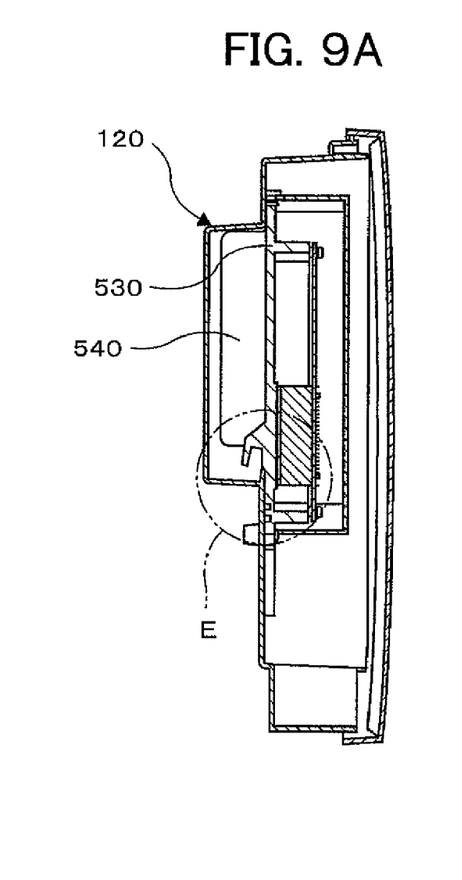
FIGS. 9A and 9B are a cross-sectional view and an enlarged view, respectively, of a portion of a canopy structure.
Figure 9B:
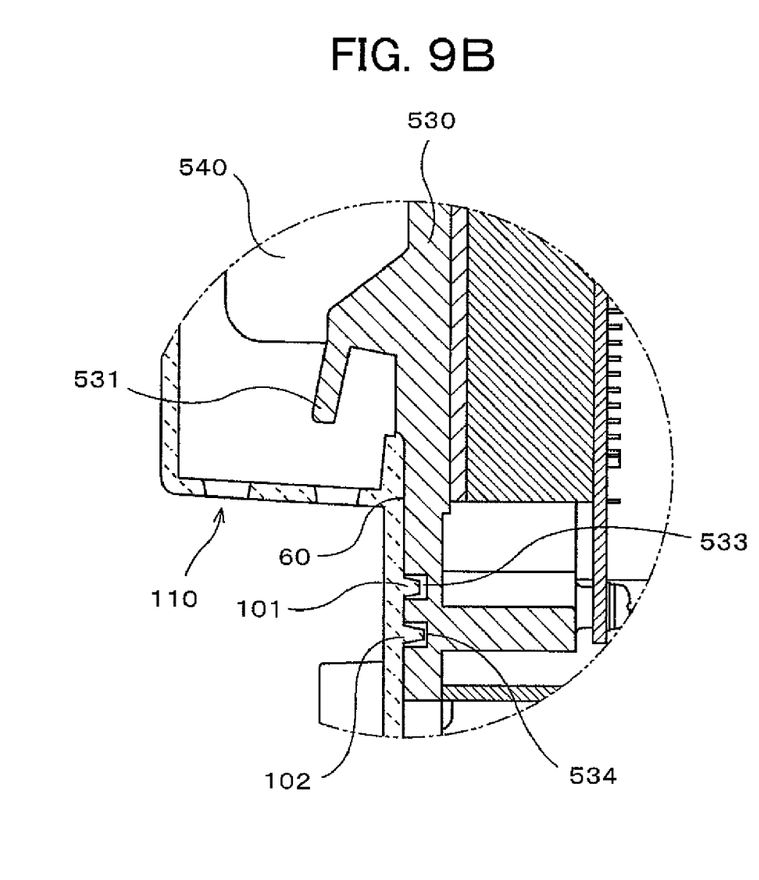
Figure 10A:
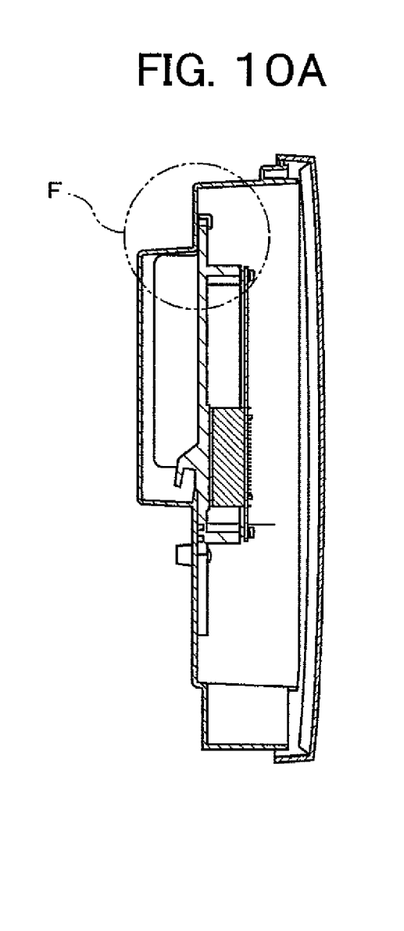
FIGS. 10A and 10B are a cross-sectional view and an enlarged view, respectively, of a fitting portion between a protrusion and a hole.
Figure 10B:
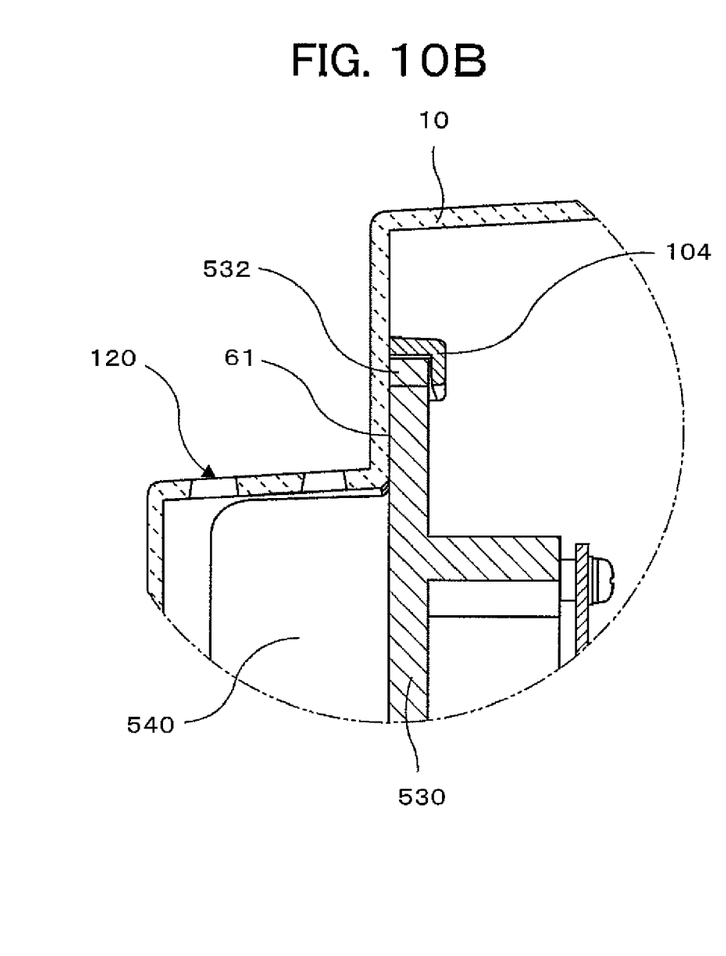
Figure 11A:
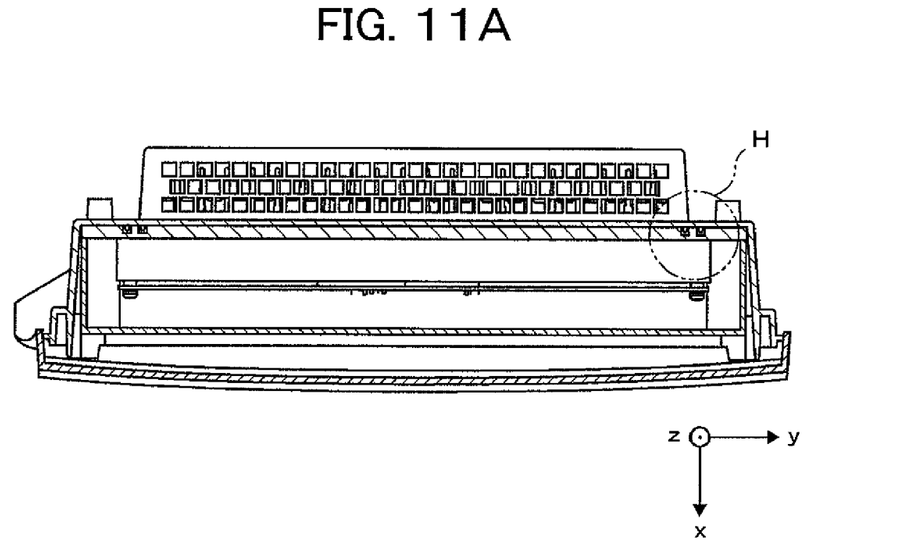
FIGS. 11A and 11B are a cross-sectional view and an enlarged view, respectively, of a portion of a gap between the upper heat sink and the case.
Figure 11B:
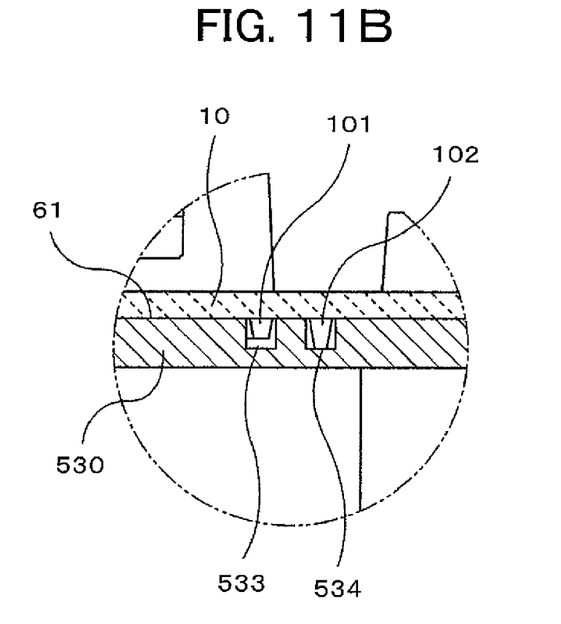

Hereinafter, a preferred embodiment will be described using examples with reference to the accompanying drawings. Identical or similar components are denoted by the same reference numerals throughout the drawings and the description will not be repeated. Here, FIG. 2 is a perspective view showing a state in which an enclosure is attached to an outdoor wall surface. FIG. 3 is a perspective view of the back side of the enclosure. FIG. 4 is a perspective view showing a state in which a cover of the enclosure of the electronic equipment is open. FIG. 5 is a front view of a case of the enclosure. FIG. 6 is a front view of a heat sink on the side of radiation fins. FIG. 7 is a cross-sectional view of the electronic equipment to be assembled. FIG. 8 is a cross-sectional view of the electronic equipment. FIGS. 9A and 9B are a cross-sectional view and an enlarged view, respectively, of a canopy portion. FIGS. 10A and 10B are a cross-sectional view and an enlarged view, respectively, of a portion of a gap between a protrusion and a hole. FIGS. 11A and 11B are a cross-sectional view and an enlarged view, respectively, of the portion of the gap between the upper heat sink and the case, as seen from another direction.

In FIG. 2, an outdoor enclosure 1 including a case 10 and a cover 20 is fixed to a wall 70. The cover 10 and the case 20 are both made of resin. Further, as shown in FIG. 3, the case 10 includes a lower air vent 110 and an upper air vent 120 for cooling streams. An internal unit 40 to be mounted can be mounted to the outdoor enclosure fixed to a wall surface 70. Incidentally, the lower air vent 110 is not shown in FIG. 3 due to perspective viewing, but it is explicitly shown in FIG. 9B described later. In addition, a mounting hole to the wall surface 70 is omitted in FIGS. 3 and 5 described later.

FIG. 4 shows electronic equipment 1000 with the cover 20 open. The electronic equipment 1000 is in a state in which the internal unit 40 is connected to the outdoor enclosure 1. In FIG. 4, the cover 20 and the case 10 are connected by hinges 30. However, it is also possible that the cover 20 is removable and fixed to the case 10 by screws. The cover 20 and the case 10 are resin sealed, making it possible to easily realize a water seal structure.

The case 10 will be described with reference to FIG. 5. In FIG. 5, the maximum profile of the case 10 is substantially square with 303×296 mm sides. The case 10 has frame-side hinge portions 31 on the left side surface, and an opening 130 of 122×212 mm in a central portion thereof. In the case 10, a first rib 101 and a second rib 102 are provided around the opening 130 except the upper side thereof. Two screw holes 103 are provided below the opening 130 of the case in order to fix the internal unit 40. There are also two holes 104 formed in a downward direction in the x-y plane above the opening 130 of the case 10 in order to fit the internal unit 40 and the case 10 together. Further, the case 10 has two ribs 105 to receive the internal unit 40 in the z-axis direction.

A heat sink 530 will be described with reference to FIG. 6. In FIG. 6, the maximum profile of the heat sink 530 is 179.5× 265 mm. The heat sink 530 has radiation fins 540, and a canopy 531 below the radiation fins 540. There are two holes 535 provided further below the canopy 531 in order to fix the internal unit 40. The canopy 531 separates water droplets flowing through the radiation fins 540, from a vertical planar portion of the body of the heat sink 530. Further, the heat sink 530 has a first groove 533 and a second groove 534 around the radiation fins 540 except the upper side thereof. Incidentally, the first groove 533 and the second groove 534 reach beyond the heat sink 530 in the z-axis direction. The heat sink 530 has protrusions 532 to be used for fitting the internal unit 40 at the both ends of the upper portion of the heat sink 530.

The components of the electronic equipment 1000 will be described with reference to FIG. 7. Here, FIG. 7 is a cross-sectional view taken along line A-A of FIG. 5. In FIG. 7, the electronic equipment 1000 is configured such that the internal unit 40 is mounted to the case 10 and then covered with the cover 20.

The internal unit 40 includes the heat sink 530, a thermally conductive sheet 550, an electronic component 560, a board 520, a unit cover 510, and board fixing screws 570. The electronic component 560 is mounted on the board 520, in which heat is transmitted to the heat sink 530 through the thermally conductive sheet 550. The heat sink 530 releases the heat from the radiation fins 540 to the atmosphere outside the enclosure. The internal unit 40 is fixed to the case 10 by using two internal unit fixing screws 580. Incidentally, the case 10 is illustrated with the side views of the hole 104 and the rib 105 that have been described with reference to FIG. 5.

The cross sectional structure of the assembled electronic equipment 1000 will be described with reference to FIG. 8. Here, FIG. 8 is also a cross-sectional view taken along line A-A of FIG. 5. The unit cover 510 is omitted for simplicity, and the hole 104 of the case 10 is viewed in a cross section taken along line B-B of FIG. 5. In FIG. 8, air entering from the lower air vent 110 of the case 10 flows upward while taking the heat out of the radiation fins 540. Then, the air flows out of the upper air vent 120. As shown in FIG. 5, the case 10 has the opening 130 into which the radiation fins 540 are inserted to cool the heated air brought into contact with external air entering from the lower air vent 110. The size of the opening 130 is determined depending on the size of the radiation fins 540 to be exposed therefrom. The size of the radiation fins 540 is determined based on the results of a thermal simulation and a temperature test.

When the internal unit 40 is mounted to the case 10, the protrusions 532 provided above the heat sink 530 are first inserted into the holes 104 of the case 10 all the way to the bottom. Next, the radiation fins 540 are inserted into the opening 130 of the case 10. In this structure, because the rib 105 of the case 10 receives the lower end surface of the heat sink 530, the internal unit 40 is prevented from falling down to the lower side. Further, because the protrusions 532 are inserted into the holes 104 of the case 10, the internal unit 40 is also prevented from falling down to the front side. For this reason, it is possible to mount the internal unit 40 to the case 10 without worrying about the internal unit 40 falling down, even in a state in which the internal unit 40 is not tightened with the screws in the replacement operation.

The mechanism to withstand the waterproof test will be described with reference to FIGS. 9A and 9B. Here, FIG. 9A is a cross-sectional view taken along line A-A of FIG. 5. FIG. 9B is an enlarged view of a portion E of FIG. 9A. In FIGS. 9A and 9B, water entering from the upper air vent 120 in a waterproof test flows downward through the heat sink 530. However, the canopy 531 serves as a draining portion, preventing the water from flowing into the gap 60 between the lower heat sink and the case. This makes it possible to prevent almost all the water from flowing into the gap between the lower heat sink and the case. For the case in which a little water flows into the gap, narrow spaces are provided in the fitting portions respectively between the first groove 533 and the second groove 534 in the heat sink 530, and the first rib 101 and the second rib 102 in the case 10. This ensures that the water is kept in the narrow spaces by its surface tension without entering into the enclosure.

Next, the water flow in the vicinity of the upper air vent 120 will be described with reference to FIGS. 10A and 10B as well as FIGS. 11A and 11B. Here, FIG. 10A is a cross-sectional view taken along line A-A of FIG. 5. The unit cover 510 is omitted for simplicity, and the hole 104 is viewed in a cross-section taken along line B-B of FIG. 5. FIG. 10B is an enlarged view of a portion F of FIG. 10A. Further, FIG. 11A is a cross-sectional view taken along line G-G of FIG. 5. FIG. 11B is an enlarged view of a portion H of FIG. 11A.

In FIGS. 10A and 10B, when water entering from the upper air vent 120 reaches a gap 61 between the upper heat sink and the case, the water is pumped up by the capillary action. Then, the pumped up water spreads over the area in which the capillary tube is formed. For this reason, in FIGS. 11A and 11B, the water spreads in the longitudinal direction along the gap 61 between the upper heat sink and the case, and reaches the first groove 533. The first groove 533 has a tiny space in which no capillary phenomenon occurs, preventing the water from spreading in the longitudinal direction across the first groove 533. The water stays in the first groove 533 due to its surface tension, or flows downward along the first groove 533. Even if the water flows across the first groove 533, the water stays in the second groove 534 due to its surface tension or flows downward along the second groove 534 in a similar manner. This ensures that the water does not enter into the enclosure. As described above, in order to prevent the water pumped up by the capillary phenomenon from entering into the enclosure, it is preferable that the first groove 533 and the second groove 534 are formed to reach the upper end surface of the heat sink 530.

If the grooves do not reach the upper end surface of the heat sink 530 and if the grooves end 10 mm from the upper end surface thereof, the portion in which the grooves are not formed might become a path through which the water flows. The first groove 533 and the second groove 534 interrupt such a water flow path. Thus, it is preferable that the first groove 533 and the second groove 534 are formed to reach the upper end surface of the heat sink 530.

The electronic equipment according to the above described embodiment has passed the waterproof test of IPX5 of International Standard IEC/EN60529 (JIS C0920). The inventors' experience shows that the electronic equipment having passed the waterproof test of IPX5 will also pass the Wind Driven Rain test without problems.

According to the above described embodiment, the internal unit can easily be joined to the enclosure temporarily. Further, the number of screws can be reduced from 8 to 2. As a result, the workability in installing/replacing the internal unit is good.

What is claimed is:
1. Electronic equipment comprising:
    an enclosure having a case with an opening formed in the case and a cover; and
    an internal unit in which an electronic component is mounted, having a heat sink for absorbing heat generated by the electronic component, a plurality of radiation fins formed in the heat sink to release the heat from the heat sink, and a draining portion formed below the radiation fins of the heat sink in a direction perpendicular to an extending direction of the radiation fins, the internal unit being mounted to the enclosure by inserting the radiation fins into the opening of the case of the enclosure,
    wherein the case has a rib arranged in a horseshoe shape around the opening except an upper portion of the opening, and
    the heat sink has a groove formed around the radiation fins except an upper portion of the opening so as to receive the rib.
2. The electronic equipment according to claim 1,
    wherein the heat sink has at least one protrusion for fitting the internal unit in an upper end surface of the heat sink, and
    the case has at least one hole into which the at least one protrusion are inserted at a position corresponding to the at least one protrusion of the heat sink and a mounting part for mounting a lower end surface of the heat sink.

3. The electronic equipment according to claim 1,
wherein both ends of the groove are formed to reach the upper end surface of the heat sink.

4. The electronic equipment according to claim 2,
wherein both ends of the groove are formed to reach an upper end surface of the heat sink.

5. The electronic equipment according to claim 1, wherein the groove and the rib are provided in plural numbers, respectively.

6. The electronic equipment according to claim 2, wherein the groove and the rib are provided in plural numbers, respectively.

7. The electronic equipment according to claim 3, wherein the groove and the rib are provided in plural numbers, respectively.

8. The electronic equipment according to claim 4, wherein the groove and the rib are provided in plural numbers, respectively.

* * * * *